(12) United States Patent
Karl

(10) Patent No.: US 9,599,709 B2
(45) Date of Patent: Mar. 21, 2017

(54) METHOD FOR DETECTING THE SURROUNDINGS OF A VEHICLE

(75) Inventor: Matthias Karl, Ettlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 131 days.

(21) Appl. No.: 13/876,405

(22) PCT Filed: Sep. 23, 2011

(86) PCT No.: PCT/EP2011/066569
§ 371 (c)(1),
(2), (4) Date: May 31, 2013

(87) PCT Pub. No.: WO2012/041772
PCT Pub. Date: Apr. 5, 2012

(65) Prior Publication Data
US 2013/0242701 A1    Sep. 19, 2013

(30) Foreign Application Priority Data

Sep. 27, 2010 (DE) .................. 10 2010 041 424

(51) Int. Cl.
| | |
|---|---|
| *G01S 15/00* | (2006.01) |
| *G01S 15/93* | (2006.01) |
| *G01S 7/00* | (2006.01) |
| *H03M 7/50* | (2006.01) |

(52) U.S. Cl.
CPC ............ *G01S 15/931* (2013.01); *G01S 7/003* (2013.01); *H03M 7/50* (2013.01); *G01S 2015/938* (2013.01)

(58) Field of Classification Search
CPC .. G01S 15/931; G01S 13/878; Y10S 367/909; G08B 13/1618
See application file for complete search history.

(56) References Cited

U.S. PATENT DOCUMENTS

| | | | | |
|---|---|---|---|---|
| 6,064,320 | A * | 5/2000 | d'Hont et al. ................ | 340/933 |
| 6,326,886 | B1 * | 12/2001 | Hoffsommer ................ | 340/435 |
| 7,580,782 | B2 * | 8/2009 | Breed et al. .................... | 701/45 |
| 2003/0156054 | A1 | 8/2003 | Ishii et al. | |
| 2004/0176892 | A1 | 9/2004 | Kumazama | |

(Continued)

FOREIGN PATENT DOCUMENTS

| | | |
|---|---|---|
| DE | 102 59 947 | 7/2004 |
| DE | 10 2007 045 561 | 4/2009 |

(Continued)

OTHER PUBLICATIONS

International Search Report, PCT International Application No. PCT/EP2011/066569, dated Dec. 13, 2011.

(Continued)

*Primary Examiner* — Omeed Alizada
(74) *Attorney, Agent, or Firm* — Gerard Messina

(57) ABSTRACT

A method for sensing the surroundings of a vehicle with a number of sensors, in which method during at least one echo cycle at least one echo information item about the surroundings is sensed by at least one sensor and is compressed using an algorithm, and in which the at least one compressed echo information item is transferred to at least one processing unit.

12 Claims, 6 Drawing Sheets

(56) References Cited

U.S. PATENT DOCUMENTS

| | | | |
|---|---|---|---|
| 2005/0036569 A1* | 2/2005 | Lu | H04B 1/7103 |
| | | | 375/316 |
| 2005/0073433 A1* | 4/2005 | Gunderson et al. | 340/903 |
| 2006/0064206 A1 | 3/2006 | Merkel et al. | |
| 2007/0052519 A1* | 3/2007 | Talty et al. | 340/10.1 |
| 2010/0277297 A1 | 11/2010 | Eckel et al. | |

FOREIGN PATENT DOCUMENTS

| | | |
|---|---|---|
| JP | S63-67847 | 3/1988 |
| JP | 63-240451 | 10/1988 |
| JP | 5-34440 | 2/1993 |
| JP | 11-183623 | 7/1999 |
| JP | 2003-127804 | 5/2003 |
| JP | 2003-240845 | 8/2003 |
| JP | 2004-537878 | 12/2004 |
| JP | 2006-508366 | 3/2006 |
| JP | 2006-335203 | 12/2006 |
| JP | 2006337160 A | 12/2006 |
| JP | 2008-152388 | 7/2008 |
| JP | 2010-212744 | 9/2010 |
| JP | 49-44828 | 6/2012 |
| WO | 2009040155 A1 | 4/2009 |

OTHER PUBLICATIONS

Miucic et al., "An Enhanced Data-Reduction Algorithm for Event-Triggered Networks," *IEEE Transactions on Vehicular Technology*, vol. 58, No. 6, pp. 2663-2678 (Jul. 2009).

Radovan Miucic et al., "An Enhanced Data-Reduction Algorithm for Event-Triggered Networks", IEEE Transactions on Vehicular Technology, vol. 58, No. 6, Jul. 2009, pp. 2663-2678.

\* cited by examiner

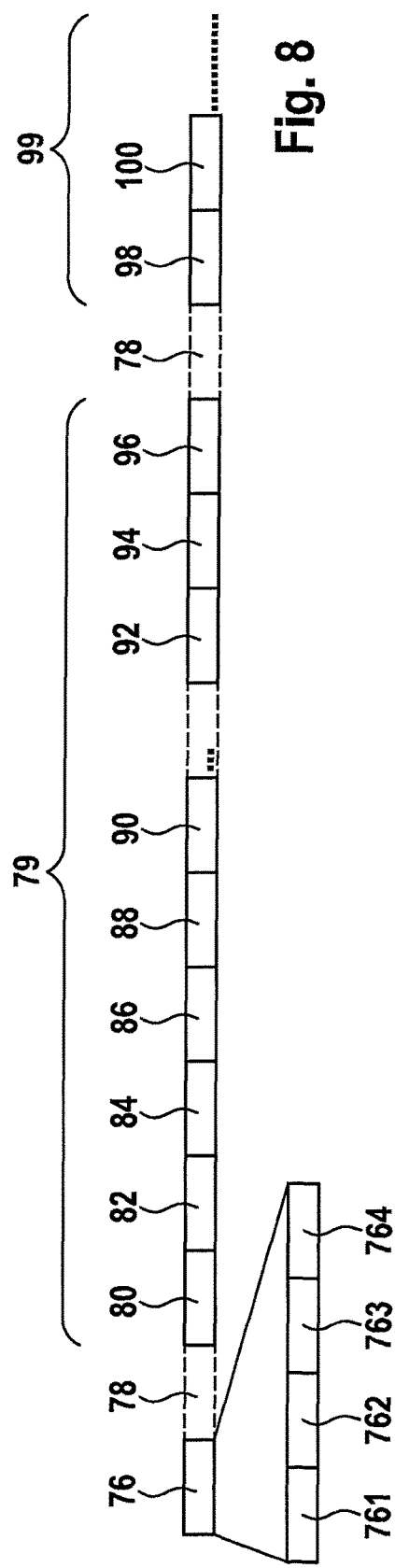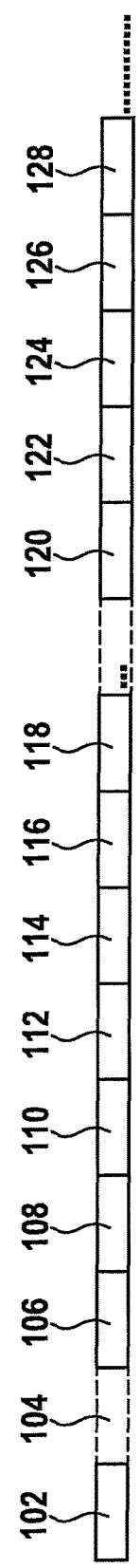

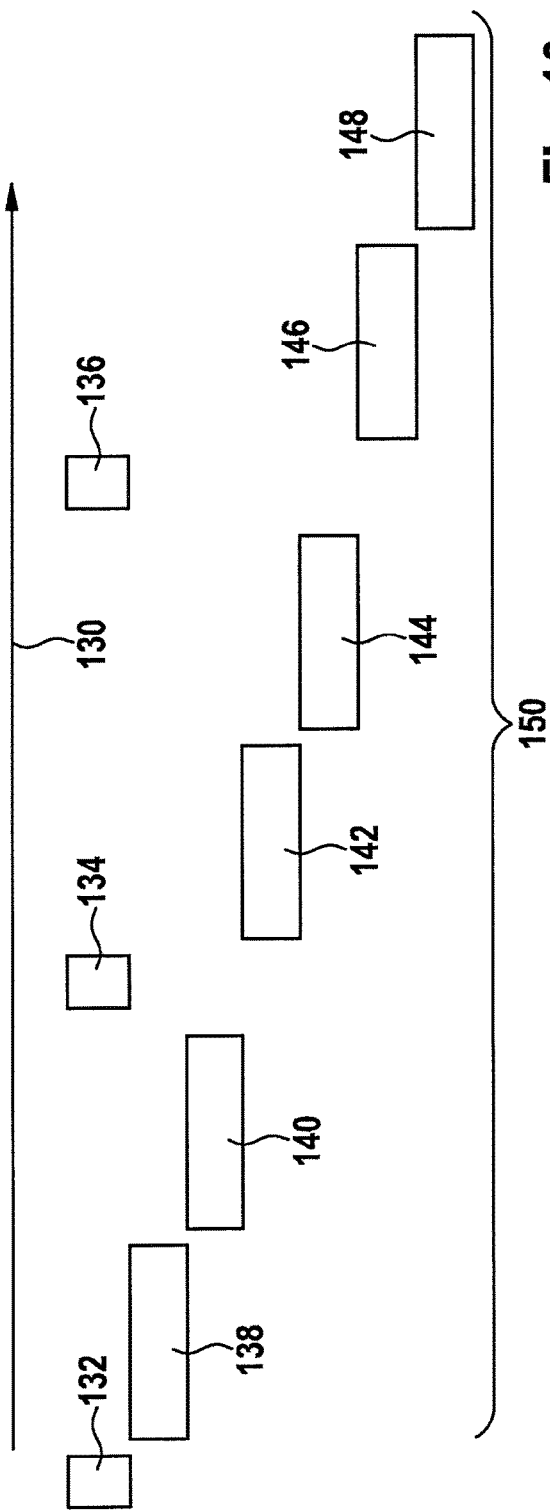
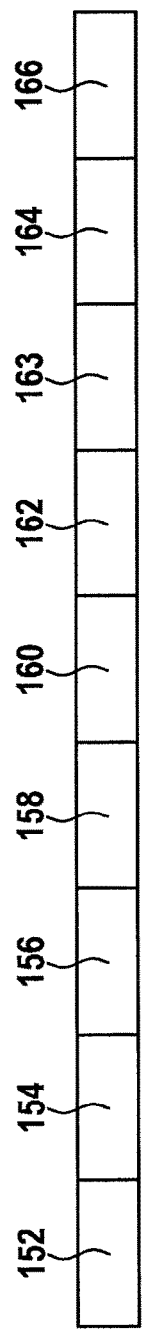

METHOD FOR DETECTING THE SURROUNDINGS OF A VEHICLE

FIELD

The present invention relates to a method and an assemblage for sensing the surroundings of a vehicle.

BACKGROUND INFORMATION

In order to detect the surroundings of a vehicle, the latter can have sensors disposed on it which sense the surroundings in noncontact fashion. With these it is possible to determine, for other objects present in the surroundings, values for kinematic variables, i.e., location, speed, and/or acceleration. Acoustic measuring devices that, for example, enable sensing of the surroundings using ultrasound, are used for this. With them, the spatial position and typically the motion of objects relative to the vehicle can be determined. Such objects can be, for example, vehicles; structures, usually curbside walls or buildings; vegetation; persons; and animals. It is thus possible to inform the driver with regard to the surroundings and/or to automatically monitor a motion of the vehicle and in that context intervene, for example, in terms of steering, acceleration, and/or braking. In addition, apparatuses for accident avoidance or for decreasing the severity of an accident, for example airbags, belt tensioners, window lifts, roof drives, and/or adjustable-height engine hoods, can be activated. The functions of such an apparatus are influenced by the monitoring of operating parameters, and said apparatuses are thus automatically actuated.

It is usual at present to connect all sensors to one control device. The result of this is that several meters of cable are required for each vehicle in order to wire up the sensors. In addition, many plug connections and installation steps are required in the context of manufacture. The increased weight thus occasioned results in elevated fuel consumption, producing additional cost and increased $CO_2$ pollution.

It is furthermore conventional, in order to implement an assemblage of sensors in a vehicle, to reduce a portion of the complex wiring and mechanisms by way of an electronic distributor designed as a cluster control device.

German Patent Application No. DE 10 2007 045 561 A1 describes a driver assistance system and a method for operating it. The driver assistance system encompasses a plurality of distance sensors that are spatially distributed and communicate with one another via a data bus. The sensors are of physically identical construction, and by way of the method presented in the document can initialize themselves without a control device, and synchronize among themselves a distance sensing of objects in the surroundings.

SUMMARY

The present invention may allow implementation of a data-compressed, robust transfer of echo information from sensors that are disposed in a vehicle in a decentralized, and generally covered, manner. Echo information of this kind is generated upon detection of the surroundings of the vehicle, typically of objects in the surroundings of the vehicle, by the sensors, which for that purpose e.g. emit ultrasonic signals.

The assemblage can interact with a driver assistance apparatus and with a driver assistance system; the method can furthermore be used to assist the driver assistance apparatus.

In addition to distance information, already known today, about objects in the surroundings, the echo amplitude and/or information as to their position, relative motion, optionally acceleration, and thus generally kinematic variables of said objects can be transferred. It is additionally possible to transfer information about an object type, and at least one distance information item. A transfer occurs using at least one sensor, disposed in decentralized fashion, via a common medium, for example an electrical or optical conductor, or via electromagnetic radio waves, to a processing unit as a rule disposed centrally. The information to be transferred, embodied here as a rule as echo information, is compressed in accordance with a previously agreed algorithm prior to transfer between components of the assemblage.

The surroundings can accordingly be sensed with the assemblage and/or using the method. Information, generally, echo information about the surroundings, can also be forwarded to a driver assistance apparatus or driver assistance system, so that it is possible to inform a driver via the driver assistance apparatus about a traffic situation, and optionally warn him or her about it. It is also possible for a regulation system of the vehicle to be automatically controlled by the driver assistance apparatus, and for the vehicle to be thereby steered and/or accelerated or braked.

The processing unit can usually initiate at least one echo cycle with echo information by sending out at least one synchronization information item, and then transfer to the sensors, successively in time or respectively in block fashion, all the information of an echo cycle at once, or transfer at least one information item in multiple transmission passes within an echo cycle.

In the case of conductor-based transfer, a medium for transferring the information can be embodied as a ring-shaped bus. At least one sensor, which is embodied in its configuration as a switching sensor, can be embodied to close or open the ring-shaped bus in controlled fashion. The at least one processing unit can have at least one interface and thus at least one outlet to the bus. If provision is made, alternatively or additionally, for a wireless transfer, for example via electromagnetic waves, a frequency separation or code separation can be implemented for signals to be transferred in that context.

In the case of conductor-based electrical transfer, energy can likewise be supplied via the typically ring-shaped bus, so that, for example in the case of three interfaces or connector pins, energy provision and information flow between components of the assemblage is possible even in the event of failure of one conductor. Energy can be supplied to each of the sensors together with energy supply to other local loads.

In the case of conductor-based transfer, at least some conductors for energy supply and/or for information transfer can be mechanically connected to one another in one physical unit, and can be combined, for example, into a ribbon cable on which at least one plug connection can be mounted by being pressed on.

In an example embodiment, the assemblage encompasses as components the sensors disposed in decentralized fashion, at least one typically centrally disposed processing unit, and the medium for transferring information.

The example method and assemblage described herein serve to control, usually to exchange, information that generally is embodied as echo information, between the sensors disposed in decentralized fashion and the at least one central processing unit. What occurs in this context is, inter alia, a transfer of echo information and/or monitoring information, received by the sensors in decentralized fashion, to the central processing unit. Exchange of the aforesaid information can occur at the beginning of an echo cycle. In an embodiment, only the necessary information is transferred, so it can be transferred using only one conductor, or only a few conductors, of the bus. The assemblage is suitable for allowing implementation of an emergency function in the event of failure of at least one component. In addition, the assemblage can automatically organize communication. The at least one processing unit can be embodied as a control device.

The example assemblage according to the present invention is embodied to carry out all the steps of the method presented. Individual steps of that method can also be carried out by individual components of the assemblage. In addition, functions of the assemblage or functions of individual components of the assemblage can be implemented as steps of the method. It is furthermore possible for steps of the method to be realized as functions of at least one component of the assemblage or of the entire assemblage.

Further advantages and embodiments of the present invention are evident from the figures and the description herein.

It is understood that the features described above and those explained below are usable not only in the respective combination indicated, but also in other combinations or in isolation, without departing from the scope of the present invention.

BRIEF DESCRIPTION OF THE DRAWINGS

FIG. 8 shows a first pattern for transferring data packets for the surroundings sensor suite.

FIG. 9 shows a second pattern for transferring data packets for the surroundings sensor suite.

FIGS. 10a and 10b show a third pattern for transferring data packets that are used in the context of an embodiment of the example method according to the present invention.

DETAILED DESCRIPTION OF EXAMPLE EMBODIMENTS

Figure 1:
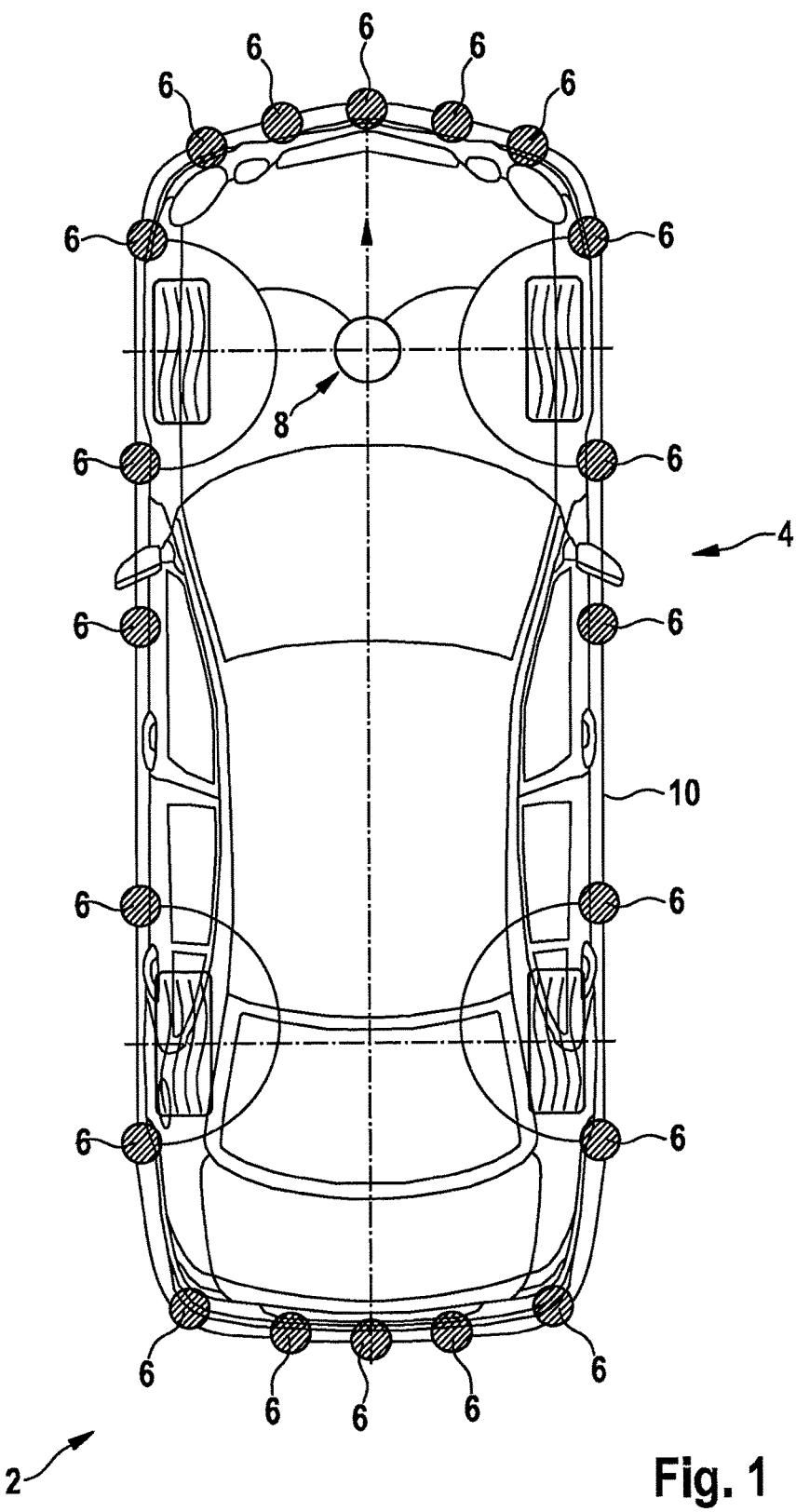
FIG. 1 schematically depicts a first embodiment of an assemblage according to the present invention.

The present invention is depicted schematically in the figures on the basis of example embodiments, and described below in detail with reference to the figures.

The Figures are described in continuous and overlapping fashion; identical reference characters signify identical components.

FIG. 1 schematically depicts a vehicle 2 having a first example embodiment of an assemblage 4 according to the present invention that has twenty sensors 6 for sensing the surroundings of vehicle 2, which here are disposed on an outer wall of vehicle 2. With these sensors 6 a front region, lateral regions, and a rear region of the surroundings, and objects present therein, can be sensed. Assemblage 4 furthermore has at least one processing unit 8, here disposed centrally.

At least one sensor 6 is embodied so that during at least one echo cycle it senses at least one echo information item with regard to the surroundings, compresses it with an algorithm, and transfers the at least one compressed echo information item to the at least one processing unit 8 embodied as a control device. At least one sensor 6 disposed on vehicle 2 emits, as signals, ultrasonic signals into the surroundings of vehicle 2. If an object happens to be located at a position in the surroundings, the emitted signals are reflected and are received again, as signals that typically are referred to as "echo signals," by the at least one sensor 6. Alternatively, the system can also receive ultrasonic signals from a sound source outside vehicle 2, for example from another vehicle or from a source located in stationary fashion on the street, which signals optionally can be reflected at objects in the vehicle surroundings. For the sake of simplicity, these signals are also referred to as "echoes." From an echo signal of this kind, the at least one echo information item, such as, e.g., a travel time since emission of the transmitted signal, an amplitude, or an information item regarding the relative motion of a transmitter, is made available. Optionally, an information item regarding a relative motion of the transmitter with respect to a receiver, and/or regarding a relative motion of a reflective object present between the transmitter and receiver, can be made available. Alternatively or additionally, information regarding a surface configuration of the reflective object that can move relative to the transmitter and/or receiver, and/or regarding an emitted signal shape, can be made available. The at least one echo information item that encompasses the aforesaid information and/or the echo amplitude is usually transmitted in at least one data packet to the at least one processing unit 8.

Assemblage 4 preferably has, as a medium for conductor-based transfer of information between the at least one processing unit 8 and sensors 6, a bus 10 embodied preferably as a ring, by way of which sensors 6 are connected to one another and to processing unit 8.

If elevation information is additionally used as a third spatial dimension, and/or in the case of longer vehicles such as, for example, trucks, in particular semi-trailers, and/or in the case of yachts, the number of additionally required sensor nodes increases.

Figure 2:
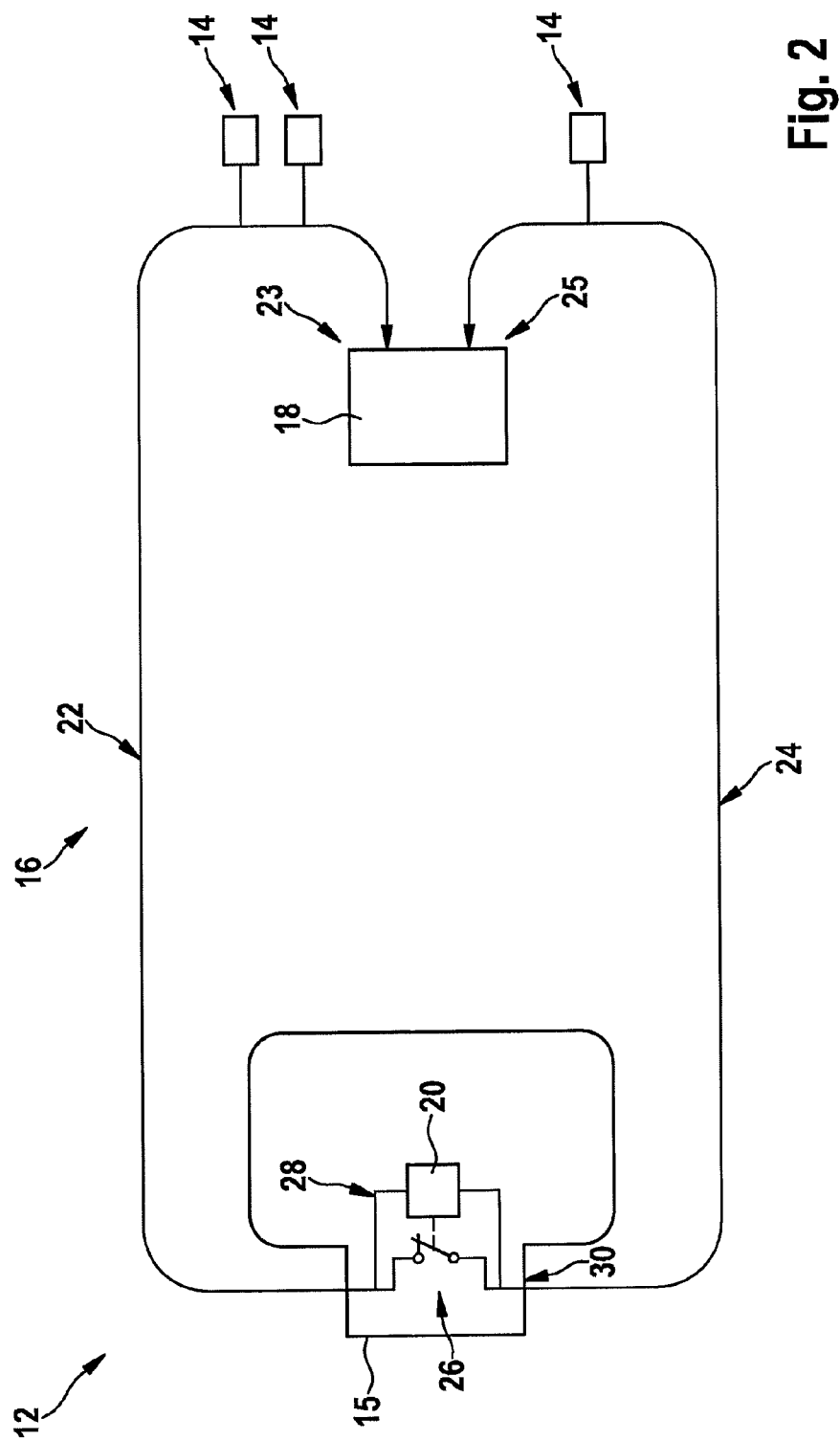
FIG. 2 schematically depicts a second embodiment of an assemblage according to the present invention.

FIG. 2 schematically depicts a possible architecture of a second (in this case, conductor-based) embodiment of an assemblage 12 according to the present invention and of a corresponding system for linking multiple sensors 14 disposed in decentralized fashion, as well as a sensor disposed in decentralized fashion and embodied as switching sensor 15, via a network embodied as bus 16, to at least one central processing unit 18, 20.

In the case depicted, bus 16 (embodied here as a ring) encompasses two ring parts 22, 24 to which a first central processing unit 18 for controlling sensors 14 and/or switching sensor 15 is connected by way of two interfaces 23, 25. Sensors 14 are connected to bus 16, for example, radially via connector elements.

The further sensor, embodied as switching sensor 15, is looped into a ring part 22, 24 by way of two connectors, and accordingly integrated or incorporated into ring parts 22, 24 so that said switching sensor 15 can disconnect or connect the two ring parts 22, 24, and thus bus 16, from or to one another by way of a disconnection apparatus 26, in time-dependent fashion and/or as a function of information (typically echo information) being exchanged via bus 16, the exchanged information being transferred in switching sensor 15 with transducers 28, 30. A processing unit 20 is furthermore integrated into the sensor embodied as switching sensor 15.

In a further embodiment, each sensor 14 or switching sensor 15 can also be connected in star fashion to bus 16, or can be integrated in through-looped form into bus 16. Bus 16 can also encompass only one strand open at one end, and/or multiple processing units 18, 20 can also be connected to bus 16 or to at least one ring part 22, 24. Alternatively or additionally, a sensor 14 and/or switching sensor 15 can at the same time take on the function of at least one processing unit 18, 20. The at least one processing unit 18, 20 can also have further direct interfaces 23, 25 and/or connectors to certain segments of bus 16.

A disconnection of bus 16, embodied in the present embodiment as a ring, by the sensor embodied as switching sensor 15 is accomplished inter alia in the case of an excessive load on bus 16, so as to achieve a greater information flow by way of the additional strand thereby made available. A disconnection can likewise occur in the event of a failure of communication on a segment of bus 16, in order to send the information to the at least one processing unit 18, 20 along at least one second pathway despite the failure. Disconnection is optionally possible in the case of an address assignment, in order to assign or allocate respective system-internal addresses, as a rule short addresses, to sensors 14 and/or to switching sensor 15 by segment-wise operation in the selected segments.

A synchronous protocol is usually used for the transfer of information, in which protocol the at least one processing unit 18, 20 sends out at least one message having a synchronization information item, informing the decentralized sensors 14 and/or switching sensor 15 as to when sensors 14 and/or switching sensor 15 have sent out signals and/or pulses, or when echo cycles are beginning, and indicating the method according to which they are to be received. Alternatively or additionally, a definition can also be given of how the information regarding echoes of objects from the surroundings, and accordingly echo information sensed by sensors 14 and/or by switching sensor 15 from the surroundings of a vehicle about objects disposed therein, are to be forwarded to the at least one processing unit 18, 20. Switching sensor 15, which can also be referred to as a "disconnect sensor," can optionally keep bus 16, embodied as a ring, respectively closed or open during the echo reception cycle.

Alternatively, electromagnetic waves can also be used as a medium for transferring information, for example utilizing a Bluetooth or WLAN protocol.

Selectably, sensors 14 and/or switching sensor 15 are informed by the at least one processing unit 18, 20 as to the data quantities that is permitted to be sent as data packets in the respective echo cycle to the at least one processing unit 18, 20. Alternatively, sensors 14 and/or switching sensor 15 can send the data, and thus the information, in accordance with a previously agreed protocol, for example by way of a previously sent quantity request or quantity query. A predefined quantity acknowledgment or quantity confirmation can then be sent by the at least one processing unit 18, 20 after reception of the data. For transmission of the data, a priority controller that is usual in the context of a bus 16 embodied as a CAN can be sent, according to which a decision is made as to which sensor and/or switching sensor 15 is permitted to transfer information quantities.

In one possible embodiment, a transfer quantity for each echo cycle is assigned to each sensor 14 and/or switching sensor 15 according to a predefined code. Sensors 14 and/or switching sensor 15 can usually optimally utilize the transfer quantities by autonomous selection of the compression method based on their own discretion. Echo information for an echo cycle can be compressed using an algorithm, and transferred as data packets.

Decentralized sensors 14 and/or switching sensor 15 can determine the particular echo travel time, echo strength or amplitude, and the respective relative motion and/or object type of the optionally present object, and/or the shape of the emitted signal, for each echo utilizing a synchronization information item of the at least one processing unit 18, 20.

The echo information for an echo cycle can be transferred via bus 16, by way of a suitable compression method, to the at least one processing unit 18, 20.

Continuous nonlinear transformations can be provided as compression methods. Examples thereof are shown in the diagrams of FIGS. 3, 4, 5, 6, and 7.

Figure 3:
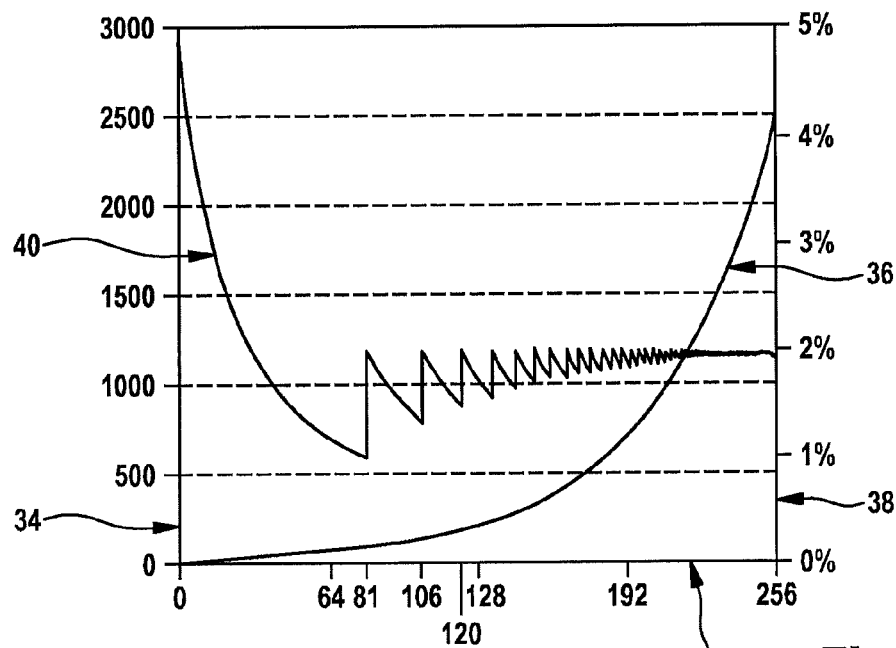
FIG. 3 schematically depicts a first diagram with an example of data that are made available in an embodiment of the example method according to the present invention.

In the diagram of FIG. 3, binary values are plotted along a horizontally oriented axis 32. Distance values 36 in centimeters for a distance of an object from a sensor are plotted along a first vertically oriented axis 34 (at left), for provision of a distance image. Values in percent for a relative imaging error 40 are plotted along a second vertically oriented axis 38 (at right). Distance values 36 and values 40 for the relative imaging error are obtained by segment-wise relative calculation.

Figure 4:
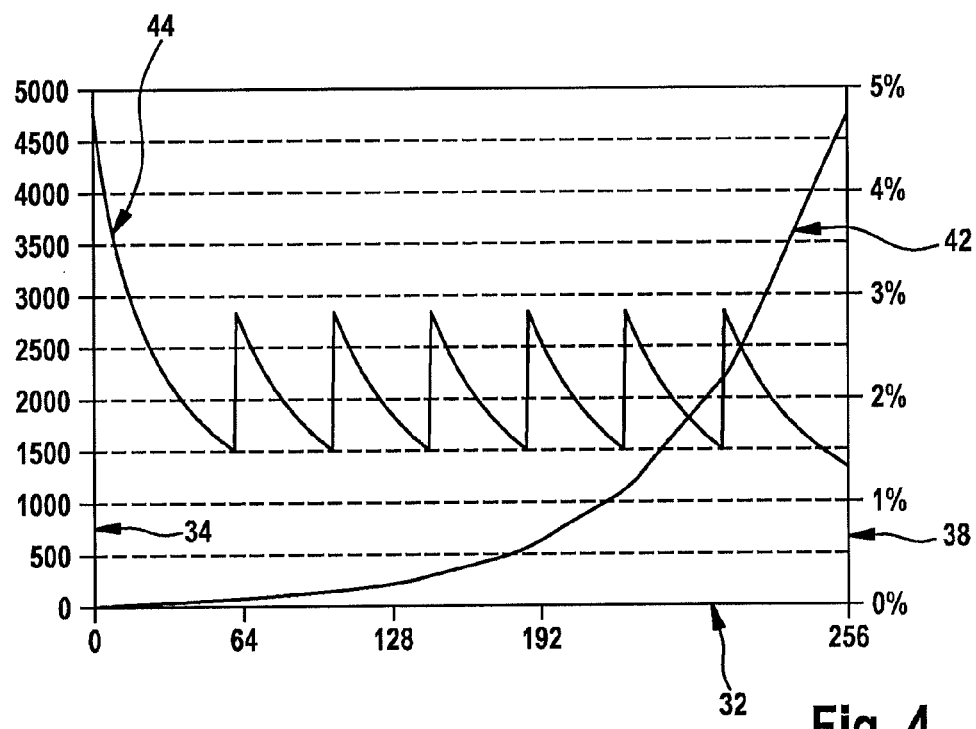
FIG. 4 schematically depicts a second diagram with an example of data that are made available in an example embodiment of the method according to the present invention.

In the diagram shown in FIG. 4, binary values are plotted along a horizontally oriented axis 32, and distance values 42 in centimeters for a distance of an object are plotted along a first vertically oriented axis 34 in order to provide a distance image to a sensor. Values (here in percent) for a relative imaging error 42 are plotted along a second vertically oriented axis 38. The curves depicted in the diagram of FIG. 4 show distance values 42 and values for a relative distance error 44. The values for the relative distance error 44 are obtained by piecemeal straight-line approximation.

Figure 5:
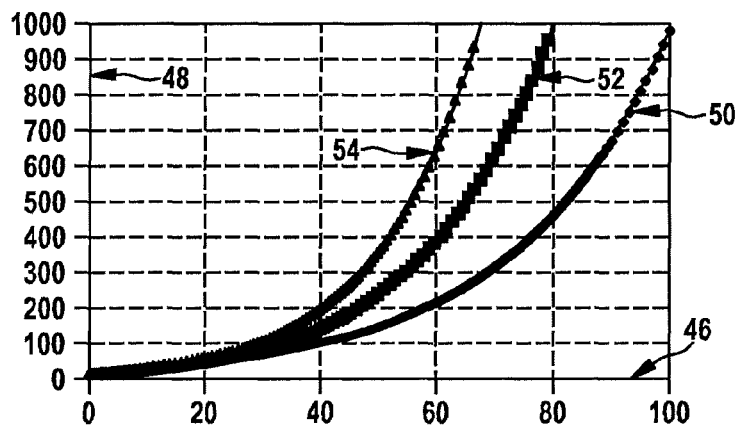
FIG. 5 schematically depicts a third diagram with an example of data that are made available in an embodiment of the example method according to the present invention.

In the diagram of FIG. 5, numbers of individual echo cycles are plotted along a horizontally oriented axis 46. Distance values in centimeters are plotted along a vertically oriented axis 48. In the diagram of FIG. 5, a first curve 50 represents percentage distance values of 4%, a second curve 52 represents percentage distance values of 5%, and a third curve 54 represents percentage distance values of 6%.

The diagram of FIG. 5 thus indicates by way of example, by stipulating relative percentage distance values, distance information for distance resolution.

In this manner, a data quantity of 7 to 8 bits, for vehicle surroundings detection using ultrasonic waves with a range of usually up to 10 m, can be compressed with a first algorithm without appreciable information loss.

Figure 6:
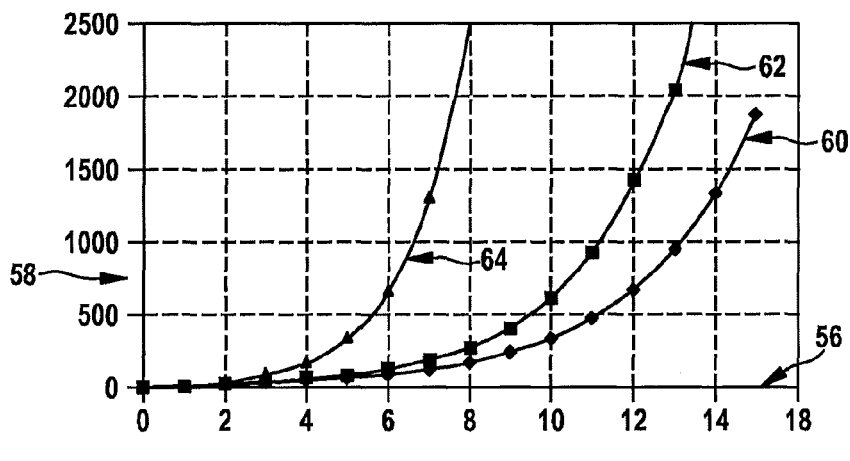
FIG. 6 schematically depicts a fourth diagram with an example of data that are made available in an embodiment of the method according to the present invention.

In the diagram of FIG. 6, numbers of echo cycles are plotted along a horizontally oriented axis 56. Provision is made in the present embodiment to represent the echo amplitude by a voltage. Plotted along a vertically oriented axis 58 are values of this voltage in millivolts, from which an amplitude level in decibels can be derived. A first curve

60 within the diagram of FIG. 6 shows values of an echo amplitude of 41%, a second curve 62 shows values for an echo amplitude of 50%, and a third curve 64 shows values for an echo amplitude of 100%. Values for signal strengths of the echo amplitudes can be compressed and thus reduced to an information quantity of 3 to 4 bits using an algorithm.

Figure 7:
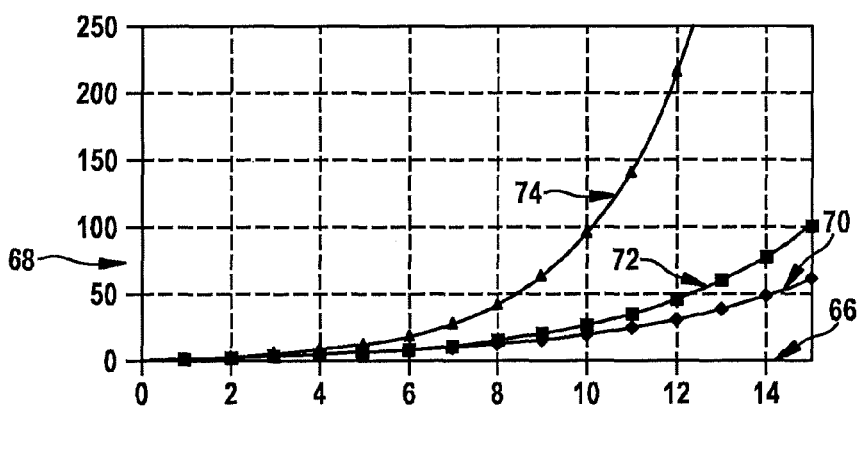
FIG. 7 schematically depicts a fifth diagram with an example of data that are made available in an example embodiment of the method according to the present invention.

In the diagram of FIG. 7, numbers of echo cycles are plotted along a horizontally oriented axis 66. Values for an echo amplitude, in km/h for a relative motion, are plotted along a vertically oriented axis 68. A first curve 70 within the diagram of FIG. 7 indicates corresponding values of echo amplitudes for 25%, a second curve 72 indicates values of echo amplitudes for 30%, and a third curve 74 indicates values of echo amplitudes for 51%.

The relative echo amplitudes for relative motion that are depicted in the diagram of FIG. 7 are indicated here by way of example as speeds. After compression using an algorithm, information quantities from 4 to 5 bits are required for signed presentation.

FIG. 8 schematically depicts a first time division pattern for a first transfer of a data flow of echo information. This pattern is suitable in particular in transfer media that cannot be clearly demarcated, for example in radio systems. With this protocol, the processing unit initiates by sending out a message sync information item 76, optionally in combination with an information item regarding the sensor transmission pattern 763 to be used and/or optionally with an information item regarding the reply pattern 764 of the sensors that is to be used. Especially in open media, such as radio transfer, unequivocal allocation to a vehicle is ensured by supplementing the message sync information item 76 with a vehicle identifier 762. In the case depicted, the message sync information item 76 is made up of a transmission off time 761 of predefined length; emission of the vehicle identification number 762 having a length of, for example, 16 bits; and the transmission pattern 762 or 763 to be used, having a length of, for example, 8 bits.

Each sensor replies to the message sync information item in accordance with the form determined previously, for example by way of the echo reply pattern 764. In the example depicted, the sync information item 78 is a transmission off time of known length between the individual reply messages 79, 99 emitted from the sensors.

If it has not already been unequivocally predefined by the transmission pattern 762 or 763, the reply message 79, 99 of a sensor encompasses at least one sensor identifier 82 and/or information regarding the structure of the echo information contained in the reply message and sent out by the sensor, as well as the information of echoes 86, 88, 90, 92, 94, 96. In the case depicted, which is preferably suitable for use of the open "radio" medium, the reply message of a sensor begins, after the synchronization information item 78, with the emission of a vehicle identifier 80 that has a length of, for example, 16 bits, followed by the sensor identifier 82, whose length is, e.g., 4 bits. In the preferred case depicted, the structure information item of the reply message contains the number N of echo information items subsequently contained in the reply message. Alternatively, in the context of a corresponding protocol agreement, all of the structural information can be dispensed with, and/or in a further manifestation, the structure of the subsequently transferred echo information items can be characterized as a function of the configuration of the echoes arriving at a sensor. If only a few echoes, in particular only one echo, arrives at a sensor within one echo cycle, the time course of the echo amplitude can be transmitted in detail. If, on the contrary, a plurality of echoes arrives at the sensor within one echo cycle, multiple echoes can then be combined into a group information item, for example based on their closeness in time and/or on the basis of similar information regarding relative motion. In the preferred case depicted, the structural information item 84 indicates the number of echoes subsequently contained in the reply message, and for each echo its echo travel time 86, 92 is transferred at, e.g., 7-bit resolution, its echo amplitude 88, 94 at, e.g., 4-bit resolution, and its relative motion 90, 96 at, e.g., 5-bit resolution. The second reply message 99 following the first reply message 79 begins with a vehicle identifier 98 followed by a sensor identifier 100.

A second example of data packets to be transferred is depicted in FIG. 9. With no use of a vehicle identifier, it is suitable in particular for transfer in closed media, such as conductors. After a longer transmission off time that is typical of the beginning of the message, the echo cycle is started by sending out the sensor transmission pattern 102 having a length of, for example, 8 bits. Transfer of the reply messages of the individual sensors begins in each case with an echo synchronization off time 104 of minimal known length. The reply message then transfers data packets for: a sensor identity 106 having, for example, 4 bits, characterizing the sensor sending the respective reply message; an optionally used transfer type 108 having, e.g., 2 bits, which describes which echo information items, and in which compression, are contained subsequently in the reply message; a number 110 of echoes, having, e.g., 2 bits; a first distance value 112 having, e.g., 8 bits; a first echo amplitude 114 having, for example, 4 bits; a first relative motion 116 having, e.g., 5 bits; and a first object type 118 having, e.g., 3 bits.

Here as well, each sequence of data packets can be repeated a suitable number of times, so that a data packet for an n-th distance value 120, a data packet for an n-th echo amplitude 122 (4 bits), a data packet for an n-th relative motion 124 (5 bits), and an n-th object type 126 (3 bits) are subsequently transferred. This is then followed by transfer of a synchronization information item 128 to synchronize the reply messages of different sensors.

Alternatively to the transfer protocol depicted in FIG. 8, in the protocol depicted in FIG. 9 the object type is also transferred with each echo. Likewise, if different transmission signal shapes occur for each echo, it is also possible to draw conclusions as to the original signal shape of the echo, and transfer it as well in each case.

If the reply messages of the sensors are sufficiently short, multiple reply messages can be transferred from a sensor within one echo cycle, preferably in such a way that that sensor which was the first to receive an echo occupies the transfer medium by immediately transferring the echo information item on the bus, and thus simultaneously informs all other transfer-capable sensors that the medium is available. The result is that the quantity of echo information to be stored in the sensors is small as compared with the approach shown in FIG. 8, and the processing unit receives contemporaneous echo information from each sensor and can accordingly react quickly in the following echo cycle, for example by configuring the transmission pattern. A disadvantage of this trial-and-error method of access to the transfer medium is that the effectively transferred data quantity is reduced because of unavoidable collisions. A further disadvantage of the purely event-driven replies of the sensors, especially in situations in which no echoes are being received, is that when receivers having low-quality time bases are used, the mutual time references of the sensors can diverge greatly from one another, which once again can result in collisions.

FIG. 10a schematically depicts an example of a time division pattern for data packets to be transmitted along a time axis 130, which pattern can be implemented in the context of an example embodiment of a method according to the present invention for a conductor-based bus conductor and/or for wireless transfer. After initial emission of at least one synchronization information item 132, 134, 136 embodied as a message sync information item, in combination with the sensor transmission pattern to be used and optionally the echo transfer pattern within an echo cycle, each sensor is briefly repeatedly given the opportunity to send at least one respective echo information item, so that the echo information items need to be stored in the sensors only briefly and therefore only in small quantities, and the delay time between reception of the echoes and transfer of the echo information to the processing unit is considerably shortened as compared with the existing art. Because the sensors transmit only as a consequence of a message sync information item, collisions are precluded as compared with the approach presented in FIG. 9.

The transmission time pattern or timing pattern of each sensor can be predefined by stipulations of the processing unit. Accurate time-related definition of the transfer operation can be determined by way of a reply instant of each sensor, on the one hand by way of the message sync information item or synchronization information item 132, 134, 136, and on the other hand by way of the transmission instants of the previously transmitting sensors, so that even a time base of low qualitative accuracy is sufficient to implement the protocol, for example by way of a universal asynchronous receiver-transmitter (UART) and thus a unit for realizing digital serial interfaces.

In detail, firstly a first synchronization information item 132 is sent out. This causes a first reply 138 of a first sensor, and a first reply 140 of a second sensor. After an off time, a second synchronization information item 134 is transmitted, followed by a first reply 142 of a third sensor and a first reply 144 of a fourth sensor. After a further off time, a third synchronization information item 136 is transferred, and then a first reply 146 of a fifth sensor as well as a first reply 148 of a sixth sensor are transferred.

The first replies 138, 140, 142, 144, 146, 148 made available as data packets in FIG. 10a encompass echo information of a first part of the echo cycle 150, as depicted here demarcated by the bracket. Further n parts of the echo information can then be transmitted or transferred as data packets within at least one further transfer cycle of the same echo cycle, which respectively encompasses the same pattern and/or a corresponding time sequence of replies 138, 140, 142, 144, 146, 148. In the variant depicted, emission of the echo information of the (for example) six sensors within one echo cycle is structured by the synchronization information items 132, 134, 136. In the embodiment depicted, only a portion of the sensors transfer echo information between two synchronization information items 132, 134, 136, in accordance with a fixedly agreed time pattern. Alternatively, each sensor can transfer a portion of its echo information for the echo cycle between two synchronization information items 132, 134, 136. In a further embodiment, the time pattern between the synchronization information items 132, 134, 136 varies, the nature of the variability generally being established by the central processing unit as a function of the echo quantity or echo significance received by the sensors in accordance with a fixed rule, or by way of a quantity request by the sensors with a subsequent quantity acknowledgment.

FIG. 10b shows, by way of example, a structure of the first replies or reply messages 138, 140, 142, 144, 146, 148 that are shown in FIG. 10a. Each reply message 138, 140, 142, 144, 146, 148 here encompasses multiple data packets as echo information that is compressed by the sensors using an algorithm. A first data packet encompasses a first distance value 152 that is derived from an echo, and has a length of 5 bits. A second data packet, having a length of 1 bit, encompasses a first echo amplitude 154. This is followed by a data packet that encompasses a first relative speed 156 and has a length of 4 bits. Transferred respectively after this is a data packet having a second distance value 158 and using 5 bits, a second echo amplitude 160 using 1 bit, and a second relative speed 162 using 4 bits. Echo information items, namely a third distance value 163 (5 bits), a third echo amplitude (1 bit), and a third relative speed 166 (4 bits) are correspondingly transferred in three further data packets. Lastly, a check datum having 2 bits is also transferred. To secure the transfer, each reply 138, 140, 142, 144, 146, 148 can be provided with a test information item that is constituted, for example, by calculating a checksum. To secure the transfer, the synchronization information item 132, 134, 136 can also contain information to confirm the previously transferred data packets and/or information regarding the data packets that will next be transferred by the sensors.

In a first data compression embodiment, provision is made that using a known reference for the synchronization information item 132, 134, 136, only the deviation of the echo information with reference to the synchronization information item 132, 134, 136, usually the distance information made available via the echo travel time and/or the echo amplitude information, is transferred at the beginning of the echo cycle.

A second embodiment of data compression or information compression encompasses the aspect that at the beginning of a transfer period each sensor transfers coarse-grained data information, and it then transfers additional fine-grained information to the extent necessary. For example, if several loud echoes arrive in quick succession at several first sensors, while no echoes arrive at other second sensors, the first sensors that received multiple echoes then, after obtaining the synchronization information items 132, 134, 136, transmit, for example, the distance information of the closest echo, while the second sensors that received no echoes reply, in response to the same or equivalent synchronization information item 132, 134, 136, that they have received no echoes. In the next synchronization information item 132, 134, 136 the central processing unit can then prompt the first sensors, which reported echoes, to transfer further echo information, and in that context can prompt those first sensors to co-utilize the transfer time segments that on average are reserved for the second sensors.

In a third data compression embodiment, the echo information is transferred as a block with indication of an integrating echo duration, instead of individually transferring the echo information items in multiple echoes located at a short distance from one another and having almost the same relative motion information.

Also possible is a fourth data compression embodiment in which as a rule only those echo information items which have changed considerably with respect to previous echo cycles are transferred, for example a drastic change in the distance to an object in the surroundings and/or in the relative motion information and/or in the echo amplitude.

In an implementation of the method according to the present invention, the aforesaid data compression embodiments can also be combined and/or supplemented in any way.

An embodiment of an assemblage or a system according to the present invention can have, for example, sixteen sensors in a bus that typically encompasses two ring halves each having eight sensors. A communication protocol on one of the two ring halves, to which the first eight sensors are connected, can encompass multiple successive echo cycles 150 each having a length of 26 ms. In a context of, for example three echo cycles 150, for each echo cycle 150 8 bits are sent out to the processing unit, and 32 bits to each of two sensors. A cable having a UART protocol with a step rate or symbol rate of 19.2 kbaud per ring half can be used, for example, as a transfer medium.

What is claimed is:

1. A method for sensing surroundings of a vehicle using a number of sensors, comprising:
    during at least one echo cycle, sensing, by at least one sensor, at least one echo information item about the surroundings, and compressing the at least one echo information item using an algorithm that includes a continuous nonlinear transformation, wherein the at least one echo information item includes information regarding at least one of: i) a relative motion between a transmitter and a receiver and ii) a surface configuration of an object present between the transmitter and receiver; and
    transferring the at least one compressed echo information item to at least one processing unit.

2. The method as recited in claim 1, wherein the at least one echo information item further includes information regarding at least one of (i) an echo amplitude and (ii) a relative motion of an object present between the transmitter and the receiver.

3. The method as recited in claim 1, wherein the at least one echo cycle for transferring the echo information is initiated by an emission of at least one synchronization information item from the at least one processing unit, and at least one echo information item is then transferred by the at least one sensor.

4. The method as recited in claim 1, wherein during the echo cycle, at least one respective echo information item is transferred, in accordance with a transmission time pattern, alternatingly and successively by multiple sensors.

5. An assemblage for sensing surroundings of a vehicle, comprising:
    at least one processing unit; and
    a number of sensors, at least one of the sensors being embodied so that during at least one echo cycle, the at least one of the sensors senses at least one echo information item about the surroundings, compresses the at least one echo information item using an algorithm that includes a continuous nonlinear transformation, and transfers the at least one compressed echo information item to the at least one processing unit, wherein the at least one echo information item includes information regarding at least one of: i) a relative motion between a transmitter and a receiver and ii) a surface configuration of the object present between the transmitter and receiver.

6. The assemblage as recited in claim 5, further comprising:
    a bus, embodied as a ring, as a medium for conductor-based transfer of information between the at least one processing unit and the sensors.

7. The assemblage as recited in claim 6, wherein at least one of the sensors, embodied as a switching sensor, is embodied to at least one of close and open the ring in controlled fashion.

8. The assemblage as recited in claim 6, wherein the ring is embodied to supply at least one component of the assemblage with energy.

9. The assemblage as recited in claim 5, in which at least two components of the assemblage are embodied for wireless transfer of information, and to use a frequency separation or code separation for signals with which the information is to be transferred.

10. The assemblage as recited in claim 6, wherein at least two conductors of the ring are mechanically connected to one another.

11. The method as recited in claim 1, wherein the at least one echo information item includes the information regarding the relative motion between the transmitter and the receiver.

12. The method as recited in claim 1, wherein the at least one echo information item includes the information regarding the surface configuration of the object present between the transmitter and receiver.

* * * * *